US008318598B2

(12) United States Patent
Beyer et al.

(10) Patent No.: US 8,318,598 B2
(45) Date of Patent: Nov. 27, 2012

(54) CONTACTS AND VIAS OF A SEMICONDUCTOR DEVICE FORMED BY A HARD MASK AND DOUBLE EXPOSURE

(75) Inventors: Sven Beyer, Dresden (DE); Kai Frohberg, Niederau (DE); Katrin Reiche, Goltzscha (DE); Kerstin Ruttloff, Hainichen (DE)

(73) Assignee: Advanced Micro Devices, Inc., Austin, TX (US)

( * ) Notice: Subject to any disclaimer, the term of this patent is extended or adjusted under 35 U.S.C. 154(b) by 494 days.

(21) Appl. No.: 12/537,321

(22) Filed: Aug. 7, 2009

(65) Prior Publication Data

US 2010/0078823 A1   Apr. 1, 2010

(30) Foreign Application Priority Data

Sep. 30, 2008 (DE) .................. 10 2008 049 727

(51) Int. Cl.
*H01L 21/4763* (2006.01)
(52) U.S. Cl. ............................. 438/618; 257/E21.577
(58) Field of Classification Search .................. 438/618; 257/E21.577
See application file for complete search history.

(56) References Cited

U.S. PATENT DOCUMENTS

| 5,598,037 | A | * | 1/1997 | Kikuchi et al. | ........... 257/773 |
| 6,911,397 | B2 | | 6/2005 | Jun et al. | ........... 438/700 |
| 7,572,572 | B2 | * | 8/2009 | Wells | ........... 430/311 |
| 2004/0021196 | A1 | * | 2/2004 | Brennan et al. | ........... 257/508 |
| 2006/0154086 | A1 | | 7/2006 | Fuller et al. | ........... 428/428 |
| 2006/0240673 | A1 | | 10/2006 | Lee | ........... 438/700 |
| 2007/0049025 | A1 | | 3/2007 | Siddiqui et al. | ........... 438/687 |
| 2007/0082472 | A1 | | 4/2007 | Chen et al. | ........... 438/597 |
| 2007/0298616 | A1 | | 12/2007 | Kim et al. | ........... 438/700 |
| 2008/0093710 | A1 | | 4/2008 | Bach | ........... 257/635 |
| 2008/0241756 | A1 | * | 10/2008 | Lehr et al. | ........... 430/312 |

FOREIGN PATENT DOCUMENTS

| DE | 102007015499 A1 | 10/2008 |
| EP | 1 577 941 A2 | 9/2005 |

OTHER PUBLICATIONS

Translation of Official Communication from German Patent Office for German Patent Application No. 10 2008 049 727.4-33 dated Aug. 11, 2009.
PCT International Search Report for PCT/EP2009/007000 dated Jan. 26, 2010.
PCT International Preliminary Report on Patentability for PCT/EP2009/007000 dated Jan. 4, 2011.

* cited by examiner

*Primary Examiner* — William D Coleman
(74) *Attorney, Agent, or Firm* — Williams, Morgan & Amerson

(57) ABSTRACT

A contact element may be formed on the basis of a hard mask, which may be patterned on the basis of a first resist mask and on the basis of a second resist mask, to define an appropriate intersection area which may represent the final design dimensions of the contact element. Consequently, each of the resist masks may be formed on the basis of a photolithography process with less restrictive constraints, since at least one of the lateral dimensions may be selected as a non-critical dimension in each of the two resist masks.

25 Claims, 10 Drawing Sheets

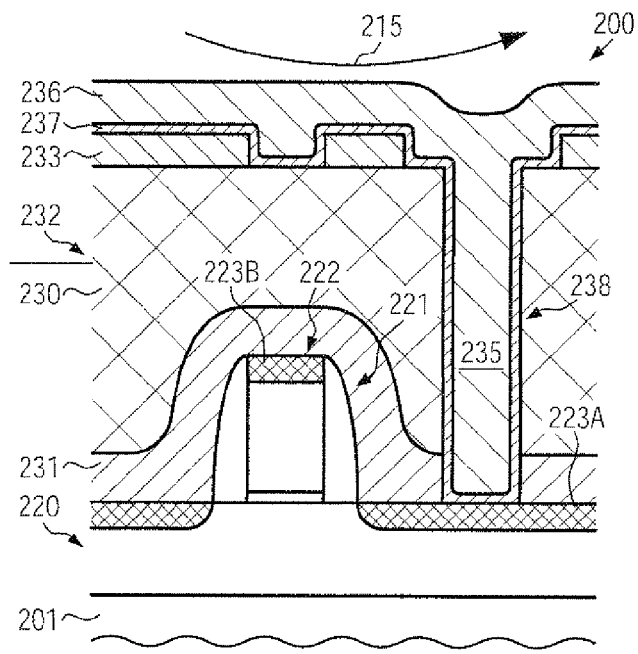
FIG. 2h
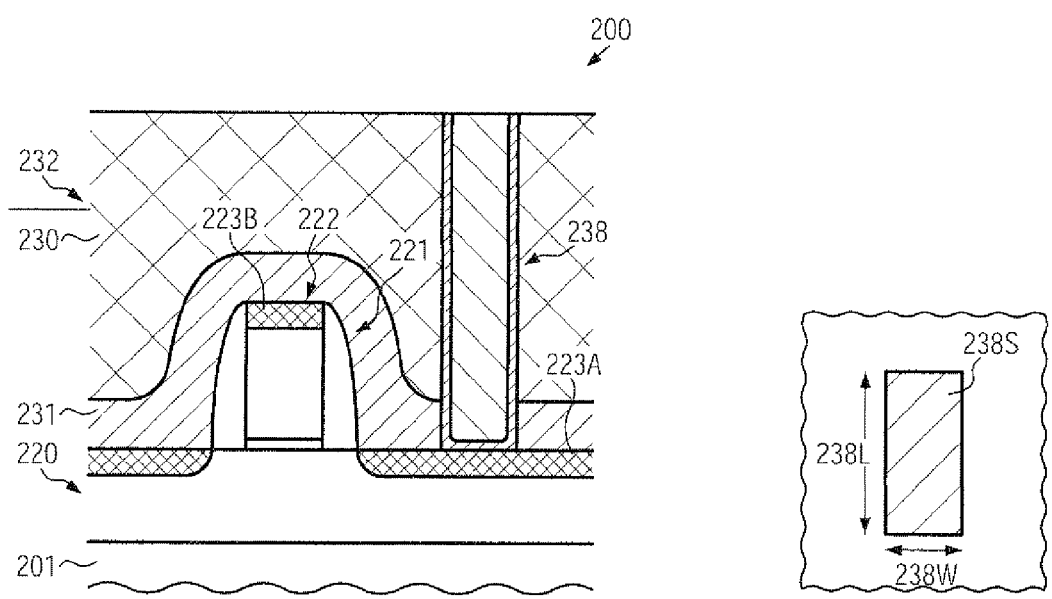
FIG. 2i
FIG. 2j

CONTACTS AND VIAS OF A SEMICONDUCTOR DEVICE FORMED BY A HARD MASK AND DOUBLE EXPOSURE

BACKGROUND OF THE INVENTION

1. Field of the Invention

Generally, the subject matter disclosed herein relates to integrated circuits, and, more particularly, to contact features for connecting contact areas or metal regions of semiconductor devices with conductive lines or regions, such as metal lines, in a higher wiring level of the semiconductor device, wherein the contact features are formed on the basis of advanced photolithography techniques.

2. Description of the Related Art

The fabrication of microstructures, such as integrated circuits, requires tiny regions of precisely controlled size to be formed in one or more material layers of an appropriate substrate, such as a silicon substrate, a silicon-on-insulator (SOI) substrate or other suitable carrier materials. These tiny regions of precisely controlled size are typically defined by patterning the material layer(s) by applying lithography, etch, implantation and deposition processes and the like, wherein, typically, at least in a certain stage of the patterning process, a mask layer may be formed over the material layer(s) to be treated to define these tiny regions. Generally, a mask layer may consist of or may be formed by means of a layer of photoresist that is patterned by a lithographic process, typically a photolithography process. During the photolithography process, the resist may be spin-coated onto the substrate surface and then selectively exposed to ultraviolet radiation through a corresponding lithography mask, such as a reticle, thereby imaging the reticle pattern into the resist layer to form a latent image therein. After developing the photoresist, depending on the type of resist, positive resist or negative resist, the exposed portions or the non-exposed portions are removed to form the required pattern in the layer of photoresist. Based on this resist pattern, actual device patterns may be formed by further manufacturing processes, such as etch, implantation and anneal processes and the like. Since the dimensions of the patterns in sophisticated integrated microstructure devices are steadily decreasing, the equipment used for patterning device features have to meet very stringent requirements with regard to resolution and overlay accuracy of the involved fabrication processes. In this respect, resolution is considered as a measure for specifying the consistent ability to print minimum size images under conditions of predefined manufacturing variations. One important factor in improving the resolution is the lithographic process, in which patterns contained in the photo mask or reticle are optically transferred to the substrate via an optical imaging system. Therefore, great efforts are made to steadily improve optical properties of the lithographic system, such as numerical aperture, depth of focus and wavelength of the light source used.

The resolution of the optical patterning process may, therefore, significantly depend on the imaging capability of the equipment used, the photoresist materials for the specified exposure wavelength and the target critical dimensions of the device features to be formed in the device level under consideration. For example, gate electrodes of field effect transistors, which represent an important component of modern logic devices, may have a length of 50 nm and less for currently produced devices, with significantly reduced dimensions for device generations that are currently under development. Similarly, the line width of metal lines provided in the plurality of wiring levels or metallization layers may also have to be adapted to the reduced feature sizes in the device layer in order to account for the increased packing density. Consequently, the actual feature dimensions may be well below the wave-length of currently used light sources provided in current lithography systems. For example, currently, in critical lithography steps, an exposure wavelength of 193 nm may be used, which, therefore, may require complex techniques for finally obtaining resist features having dimensions well below the exposure wavelength. Thus, highly non-linear processes are typically used to obtain dimensions below the optical resolution. For example, extremely non-linear photoresist materials may be used, in which a desired photochemical reaction may be initiated on the basis of a well-defined threshold so that weakly exposed areas may not substantially change at all, while areas having exceeded the threshold may exhibit a significant variation of their chemical stability with respect to a subsequent development process.

The usage of highly non-linear imaging processes may significantly extend the capability for enhancing the resolution for available lithography tools and resist materials.

Due to the complex interaction between the imaging system, the resist material and the corresponding pattern provided on the reticle, even in highly sophisticated imaging techniques, which may possibly include optical proximity corrections (OPC) and the like, the consistent printing of latent images, that is, of exposed resist portions, which may be reliably removed or maintained, depending on the type of resist used, may also significantly depend on the specific characteristics of the respective features to be imaged. For instance, it has been observed that line-like features having a specific design width and a design length may require specific exposure recipes for otherwise predefined conditions, such as a specified lithography tool in combination with a specific reticle and resist material, in order to reliably obtain the desired critical width dimension, while the length dimension is less critical, except for respective end portions, so-called end caps of the respective lines, which may also typically require respective corrections. Consequently, for other features having critical dimensions in two lateral directions, such as substantially square-like features, the same exposure recipe as used for line-like features may not be appropriate and may, therefore, require elaborated process parameters, for instance with respect to exposure dose and OPC, and the like. Furthermore, the respective process parameters in such a highly critical exposure process may have to be controlled to remain within extremely tight process tolerances compared to a respective exposure process based on line-like features, which may contribute to an increasing number of non-acceptable substrates, especially as highly scaled semiconductor devices are considered. Due to the nature of the lithography process, the corresponding process output may be monitored by respective inspection techniques in order to identify non-acceptable substrates, which may then be marked for reworking, that is, for removing the exposed resist layer and preparing the respective substrates for a further lithography cycle. However, lithography processes for complex integrated circuits may represent one of the most dominant cost factors of the entire process sequence, thereby requiring a highly efficient lithography strategy to maintain the number of substrates to be reworked as low as possible. Consequently, the situation during the formation of sophisticated integrated circuits may become increasingly critical with respect to throughput.

With reference to FIGS. 1a-1c, a typical process sequence for forming vias or contacts and line-like features may be described in order to more clearly demonstrate the problems involved in the manufacturing process for forming advanced semiconductor devices.

FIG. 1a schematically illustrates a top view of a semiconductor device 100 in a manufacturing stage after a respective lithography process including a respective development step. The semiconductor device 100 may comprise a resist layer 110, which may be formed above a respective material layer, as will be described later on with reference to FIG. 1b. The resist layer 110 has formed therein respective resist openings 110A having lateral dimensions in a length direction L and a width direction W, indicated as 110L, 110W. The respective lateral dimensions 110L, 110W may be similar if, for instance, a substantially square-like feature is to be formed on the basis of the resist openings 110A. As previously explained, for highly sophisticated applications, the corresponding lateral dimensions 110L, 110W may represent critical dimensions for the device layer under consideration, i.e., these lateral dimensions may represent the minimum dimensions to be printed in the corresponding device level. The respective resist openings 110A are to be used as etch masks for patterning the underlying material layer in order to form respective openings therein that, in turn, may be used for forming appropriate device features, such as contacts, vias and the like, which may provide contact to overlying and underlying device features, such as metal regions, metal lines and the like. For example, it may be assumed that a connection to a respective line feature is to be provided in a subsequent device level, wherein it may be assumed that the corresponding line features, indicated by dashed lines, may have substantially the same critical dimension in the width direction W.

FIG. 1b schematically illustrates the semiconductor device 100 in a cross-sectional view taken along the line Ib-Ib from FIG. 1a. The semiconductor device 100 in this manufacturing stage comprises a substrate 101, which may represent an appropriate carrier material including the respective material layers (not shown) which may comprise device features, such as transistors, capacitors and the like. Furthermore, a dielectric layer 102 comprised of any appropriate dielectric material, such as silicon dioxide, silicon nitride, combinations thereof and the like, is formed above the substrate 101 and comprises a respective opening 102A having similar lateral dimensions as the respective resist opening 110A. Furthermore, a further dielectric layer 103, for instance an anti-reflective coating (ARC) layer and the like, may be formed on the dielectric layer 102 in order to assist the respective exposure process for patterning the resist layer 110. The layer 103 may be formed of any appropriate material, such as silicon oxynitride, silicon nitride and the like.

The semiconductor device 100 as shown in FIG. 1b may be formed on the basis of the following processes. After providing respective device features in and above the substrate 101, the dielectric layer 102 may be deposited on the basis of well-established manufacturing techniques, which may comprise chemical vapor deposition (CVD) processes and the like. For instance, sophisticated CVD techniques for forming silicon nitride, silicon dioxide and the like are well established in the art, for instance, for providing a reliable encapsulation of respective device features, such as transistors and the like. After the deposition of the layer 102, a respective planarization process may be performed, if required, to enhance the surface topography prior to forming the layer 103 and the resist layer 110. In other cases, the respective surface topography may be maintained and may be taken into account by appropriately forming the resist layer 110. The resist layer 110 may be prepared for a subsequent exposure process on the basis of established treatments, such as pre-exposure bake and the like, to enhance process uniformity. Thereafter, the resist layer 110 may be exposed on the basis of a respective photomask or reticle, which may comprise corresponding mask features that may possibly be designed on the basis of appropriate correction techniques in order to take into account the respective non-linearity of the corresponding exposure process, as previously described. In other cases, any other appropriate techniques, such as phase shift masks and the like, may be used. During the exposure process, typically, a well-defined exposure field may be illuminated by an optical beam that is modulated by the pattern included in the reticle to transfer the reticle pattern into the resist layer 110 in order to define a respective latent image. That is, the latent image may be understood as a respective portion of the resist layer 110 receiving a significant amount of radiation energy in order to modify the photochemical behavior of the corresponding resist material. In the present case, it may be assumed that a positive resist may be used which may become soluble upon exposure during a subsequent development step. Consequently, during the respective exposure process, the substrate 101 is appropriately aligned and thereafter a certain exposure dose is transferred into the respective exposure field under consideration in order to create the respective latent images, wherein the mask features and/or the imaging techniques may be selected such that a certain threshold of energy for generating a required photochemical modification may be accomplished within specified areas according to the desired design dimensions of the respective features. That is, in the above-described case, the exposure process is designed in combination with respective mask features so as to deposit sufficient energy within an area corresponding to the openings 110A having the lateral dimensions 110L, 110W in order to obtain a substantially complete removal of the exposed resist material during the subsequent development step. Due to the minimum dimensions in both lateral directions, respective process parameters of the exposure process, such as exposure dose and the like, as well as of any pre-exposure and post-exposure processes, may have to be maintained within tightly set process margins in order to obtain the resist openings 110A since even some incompletely opened areas within the resist opening 110A may result in corresponding irregularities during the subsequent etch process for forming the openings 102A in the dielectric layer 102. Hence, after developing the exposed resist layer 110, i.e., after removing exposed portions of the resist material, an inspection of the substrate 100 may be performed in order to identify exposure fields outside the respective specifications. Due to the very tight process margins for forming the critical openings 110A, a corresponding high number of non-acceptable exposure fields, each of which may be exposed on the basis of an individually adjusted exposure dose, may occur in particular if highly scaled devices are considered, in which the respective lateral dimensions 110L, 110W may be approximately 100 nm and less.

FIG. 1c schematically illustrates the device 100 in a cross-sectional view according to the section Ic-Ic in FIG. 1a in an advanced manufacturing stage. Here, the opening 102A may be filled with an appropriate material, such as a metal, and a further dielectric layer 104 may be formed above the layer 102 which comprises a further line-like feature 104A. Furthermore, a resist layer 120, possibly in combination with a respective ARC layer 113, may be formed above the dielectric layer 104 including respective trench-like openings 120A having the lateral dimension 110W. In this case, it is assumed that the width of the resist opening 120A may substantially correspond to the critical dimensions of the resist openings 110A.

A respective process flow for forming and patterning the layers 104, 113 and 120 may comprise substantially the same process steps as described with reference to FIG. 1b. However, as previously explained, during the corresponding lithography sequence including any pre- and post-exposure processes, it has been observed that corresponding process tolerances may be less critical compared to the exposure process for forming the openings 110A, which is believed to be caused by the lack of respective boundary conditions in the lateral length direction L. For example, the respective resist opening 120A may be formed with a reduced exposure dose compared to the opening 110A, while also other process parameters may be less critical, thereby providing a moderately wider process window for the corresponding lithography process for forming the line-like features 120A.

Since respective resist openings 110A for contacts and vias may have to be provided at various manufacturing stages, the very tight process tolerances to be met may thus significantly contribute to a reduced overall throughput of the per se very cost intensive lithography module, which may, therefore, significantly contribute to overall production costs. Furthermore, the respective exposure processes may be restricted to highly advanced lithography tools only, thereby even more increasing the overall production costs. Furthermore, the fabrication of contacts on the basis of substantially circular cross-sections may contribute to significant yield losses due to patterning-related process fluctuations as described above, while also the contact resistance, for instance for connecting the very first metallization layer with the active semiconductor regions, is moderately high.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to process techniques and semiconductor devices in which a critical exposure process, for instance during the formation of contact elements connecting to contact areas of transistors and the like, may be replaced by two less critical exposure processes using two successively formed resist masks obtained by the two less critical exposure processes in order to appropriately pattern a hard mask layer, which may then be used for transferring the actual contact opening into the lower lying dielectric material. To this end, each of the resist masks used for patterning the hard mask layer may exhibit at least one lateral dimension that may be obtained with less restrictive constraints in view of the photolithography process, as previously described, thereby contributing to overall increased process flexibility, since less sophisticated lithography tools may be used or, for given lithography tools, the error rate of the entire exposure process and the related patterning sequence may be reduced. For example, the mask layer may be patterned in a first step on the basis of a resist mask which may have an elongated shape, thereby relaxing overall exposure-related constraints, while the desired lateral dimension along the length direction of the initial opening in the hard mask layer may then be determined on the basis of a second resist mask, which may be provided by a separate exposure step, wherein, also, at least one or even both lateral dimensions may be selected as "non-critical" dimensions, depending on the desired size of the final contact opening. Consequently, any process-related constraints with respect to the critical contact patterning sequence may be significantly relaxed while also providing the possibility of appropriately adjusting the size of the corresponding contact elements, at least in one lateral dimension, according to device requirements, for instance, in view of reducing the overall contact resistivity. Similarly, respective "contacts" or vias may be formed in the metallization levels of sophisticated semiconductor devices in which more or less critical exposure and patterning process sequences may be required.

One illustrative method disclosed herein comprises forming a first resist mask above a hard mask layer formed on a material layer of a semiconductor device. The method further comprises forming a first opening in the hard mask layer on the basis of the first resist mask, wherein the first opening has a first dimension along a first lateral direction and has a second dimension along a second lateral direction that is different from the first lateral direction and wherein the first dimension is less than the second dimension. Additionally, the method comprises forming a second resist mask above the hard mask layer, wherein the second resist mask has a second opening that defines an intersection area with the first opening. Finally, the method comprises forming a contact opening in the material layer on the basis of the intersection area.

A further illustrative method disclosed herein comprises forming a hard mask layer above an interlayer dielectric material of a semiconductor device. Moreover, an opening is formed in the hard mask layer by using a first resist mask, wherein the opening has a rectangular portion. The method further comprises forming a mask opening in the rectangular portion using a second resist mask, wherein the mask opening extends through the hard mask layer. Additionally, the method comprises forming a contact opening in the interlayer dielectric material by using the mask opening, wherein the contact opening extends through the interlayer dielectric material.

One illustrative semiconductor device disclosed herein comprises a plurality of circuit elements formed in and above a semiconductor layer. Furthermore, a contact region is provided and connects to at least one of the plurality of circuit elements and an interlayer dielectric material encloses the plurality of circuit elements. Furthermore, the semiconductor device comprises a contact element extending through the interlayer dielectric material and connecting to the contact region, wherein the contact element forms a rectangular elongated interface with the contact area.

BRIEF DESCRIPTION OF THE DRAWINGS

The disclosure may be understood by reference to the following description taken in conjunction with the accompanying drawings, in which like reference numerals identify like elements, and in which:

FIGS. 1b-1c schematically illustrate cross-sectional views of the semiconductor device shown in FIG. 1a;

FIG. 2h schematically illustrates the semiconductor device in a further advanced manufacturing stage in which residues of the hard mask layer may be removed, according to illustrative embodiments;

FIGS. 2i-2j schematically illustrate a cross-sectional view and a top view, respectively, of the semiconductor device in various manufacturing stages in patterning a hard mask layer comprising two sub-layers, according to further illustrative embodiments.

Figure 1A:
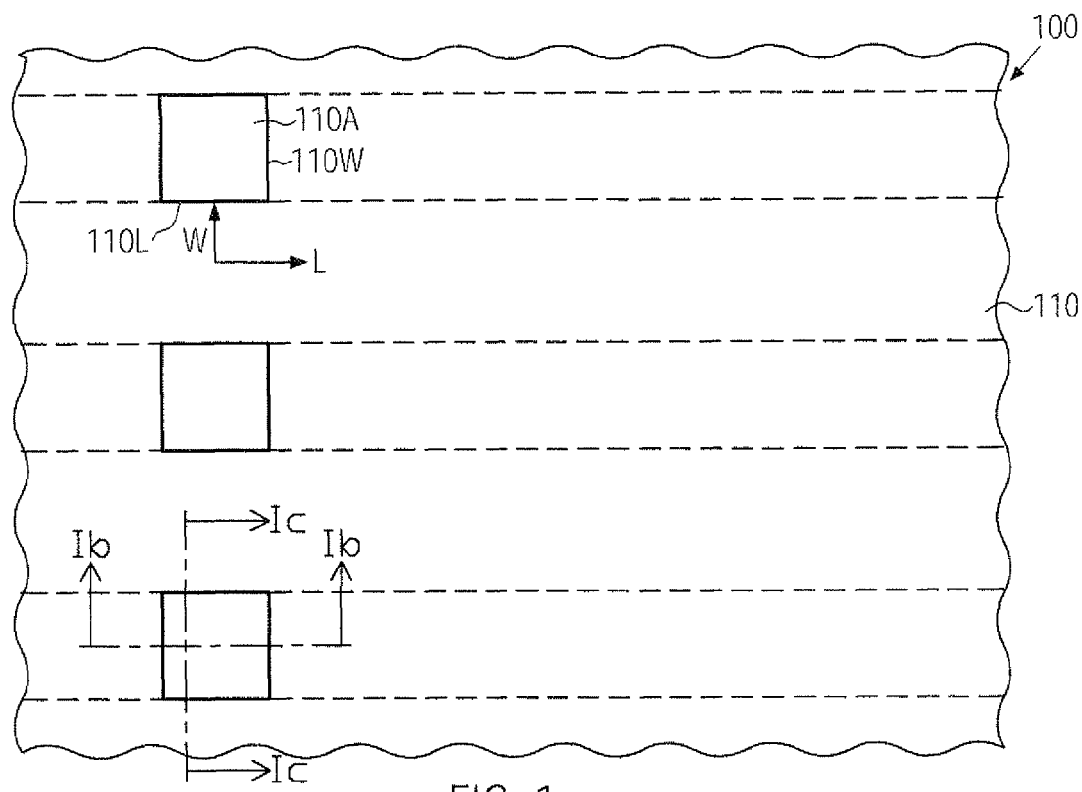
FIG. 1a schematically illustrates a top view of a semiconductor device including resist openings having critical dimensions in two lateral directions, formed in accordance with conventional exposure strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides process techniques and semiconductor devices for enhancing the patterning of critical contact elements, for instance contact elements connecting to contact areas of circuit elements, such as transistors, or contacts in the form of vias connecting to a lower lying metal region in the metallization system of sophisticated semiconductor devices. Typically, contacts and vias may have similar dimensions in the respective lateral directions according to conventional strategies, thereby requiring tight process parameter control and sophisticated exposure tools during the corresponding process for forming the respective resist mask, as previously explained. In order to significantly relax the respective constraints, i.e., providing less restrictive process windows for the overall process sequence, it is taken advantage of the fact that critical dimensions in one specific lateral dimension may be obtained on the basis of less critical lithography requirements, as long as the corresponding orthogonal lateral dimension is significantly greater. Consequently, by using two separately formed resist masks based on less critical mask openings, a corresponding intersection area may be formed in the hard mask layer, which may have the desired design dimensions in both lateral directions without requiring highly complex and critical exposure process techniques. That is, at the respective intersection area formed by two independently provided resist masks in combination with the hard mask, the desired overall lateral dimensions of the contact opening to be formed may be defined as may be required by design rules, without having to perform one highly critical lithography step. For instance, if critical dimensions in both lateral directions may be required, each of the corresponding resist masks may still be provided on the basis of less critical lithography parameters, while, on the other hand, increased flexibility may be provided in appropriately adapting at least one lateral dimension of the finally obtained contact opening, wherein at least one of the resist masks may be formed on the basis of a non-critical lithography process since both lateral dimensions of the corresponding mask opening may be selected to be well above any critical dimension. Respective contact failures may be significantly reduced and increased process flexibility may also be obtained, for instance, in terms of the possibility of using less advanced lithography tools and the like.

Figure 1B:
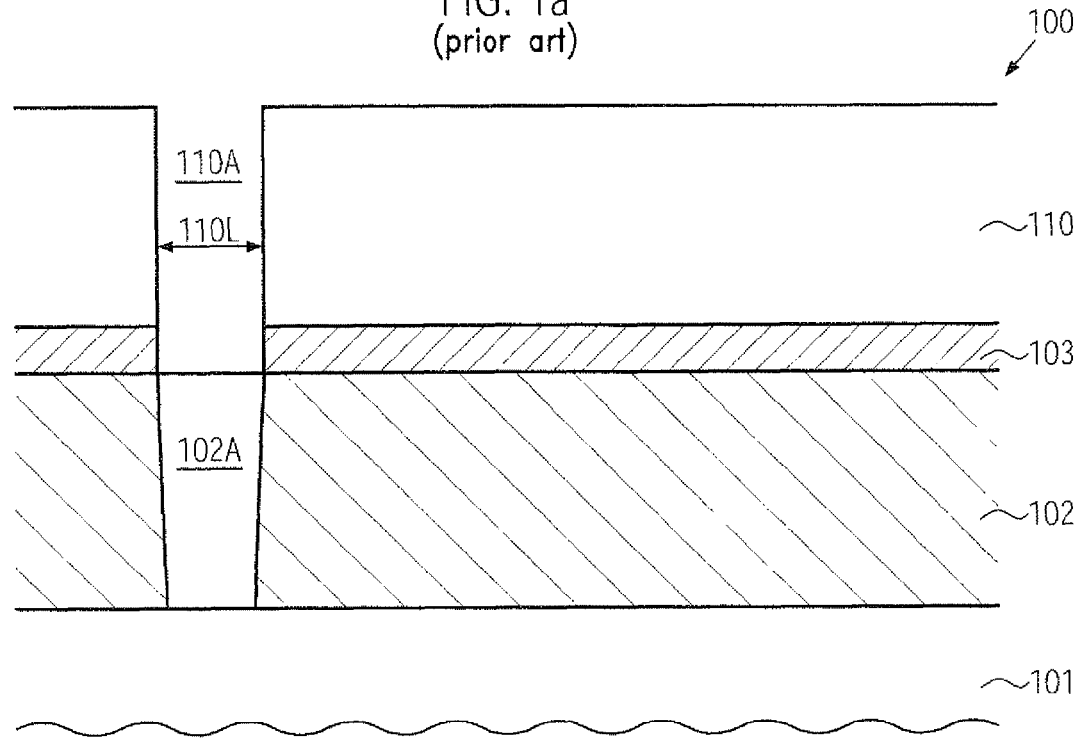
Figure 1C:
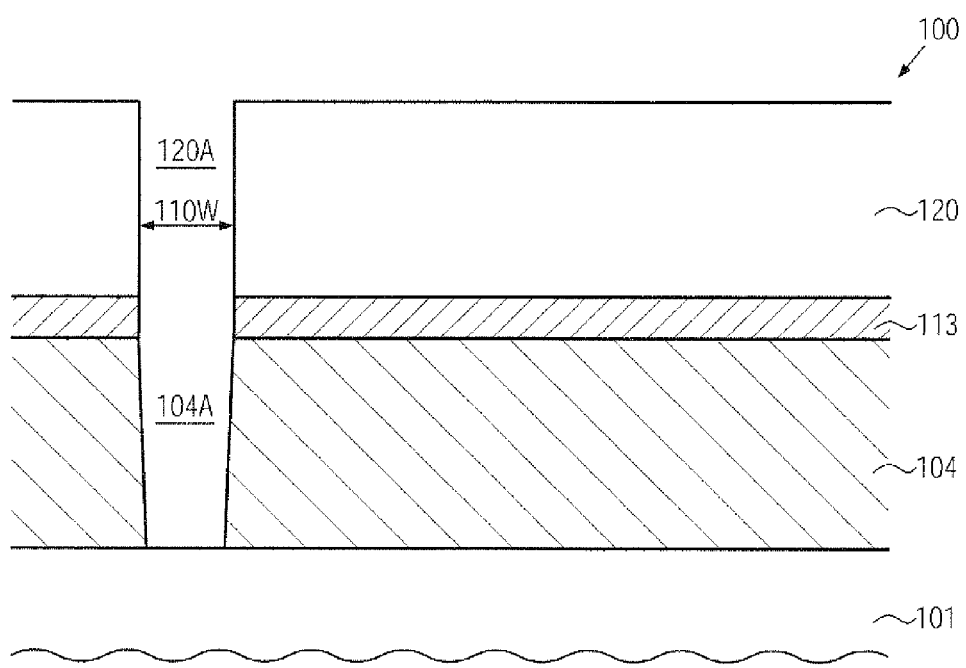
Figure 2A:
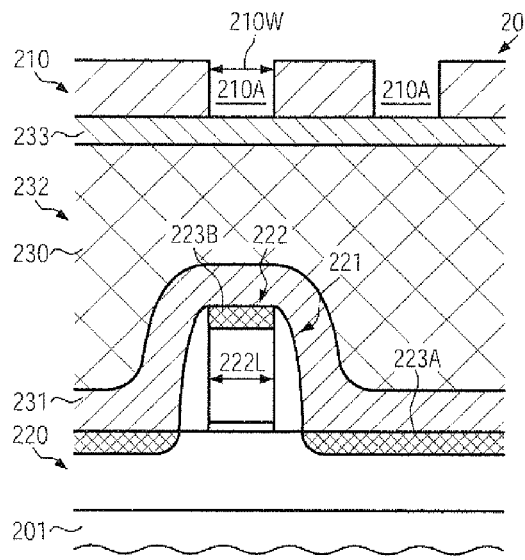
FIG. 2a schematically illustrates a cross-sectional view of a semiconductor device in which an interlayer dielectric material is to be patterned on the basis of a hard mask and two less critical lithography steps, according to illustrative embodiments.
Figure 2B:
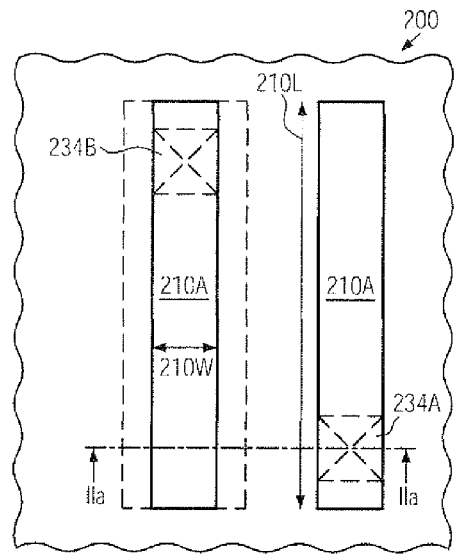
FIG. 2b schematically illustrates a top view of the device of FIG. 2a, indicating positions of corresponding contacts to be formed.
Figure 2C:
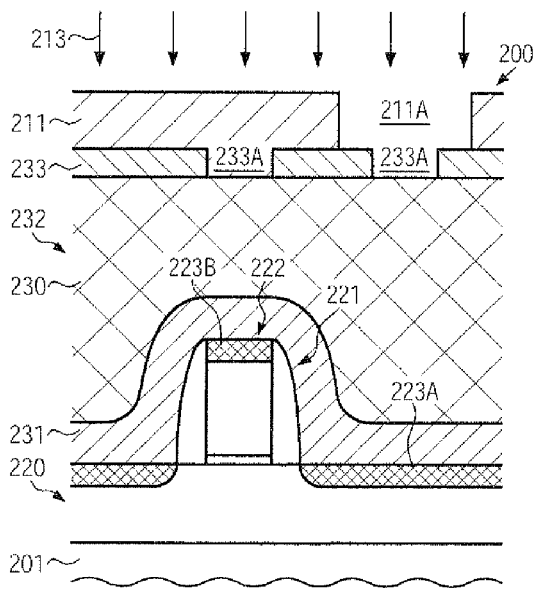
FIG. 2c schematically illustrates the semiconductor device in a further advanced manufacturing stage, in which the position and the size of a contact opening are defined on the basis of a second resist mask, according to illustrative embodiments.
Figure 2D:
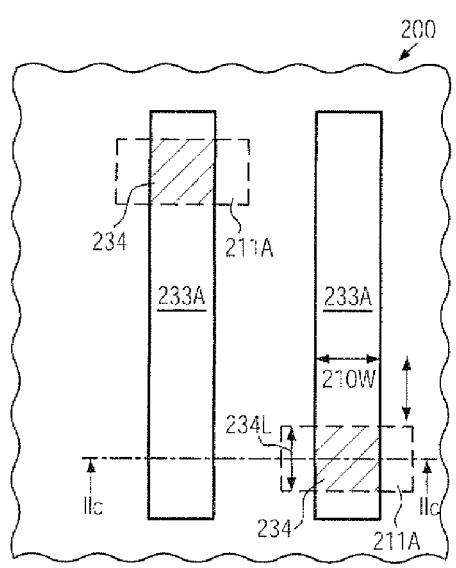
FIG. 2d schematically illustrates a top view of the device of FIG. 2c, indicating an intersection area for defining the size and position of respective contact elements.
Figure 2E:
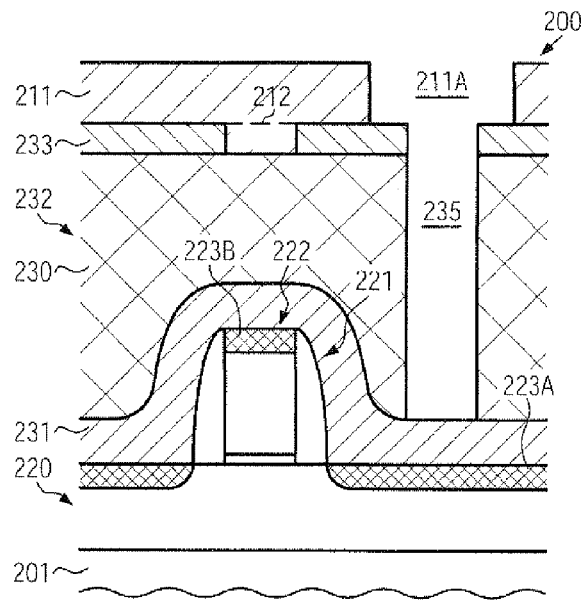
FIGS. 2e-2f schematically illustrate cross-sectional views of the semiconductor device during various manufacturing stages in forming the contact opening on the basis of a hard mask layer and the resist mask, according to illustrative embodiments.
Figure 2F:
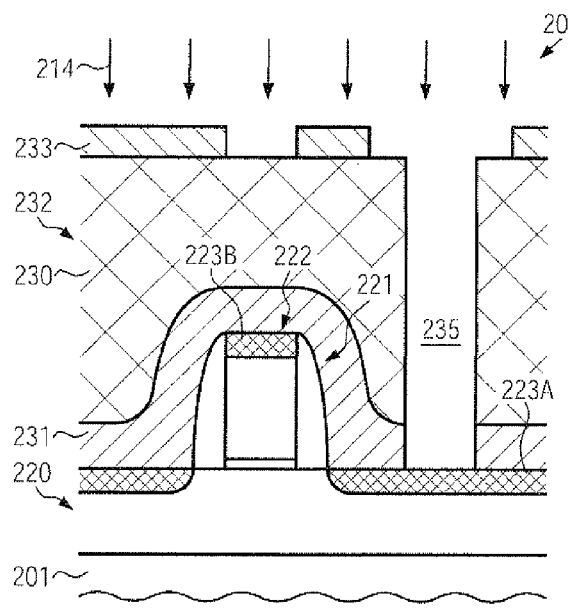
Figure 2G:
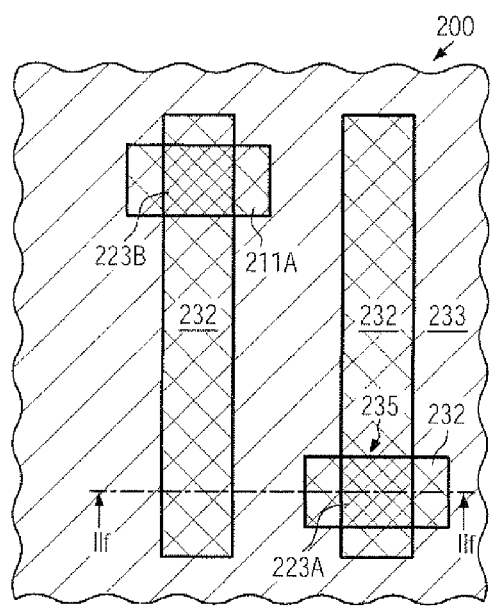
FIG. 2g schematically illustrates a top view of the device of FIG. 2f, after forming the contact openings so as to extend to a contact area.
Figure 2K:
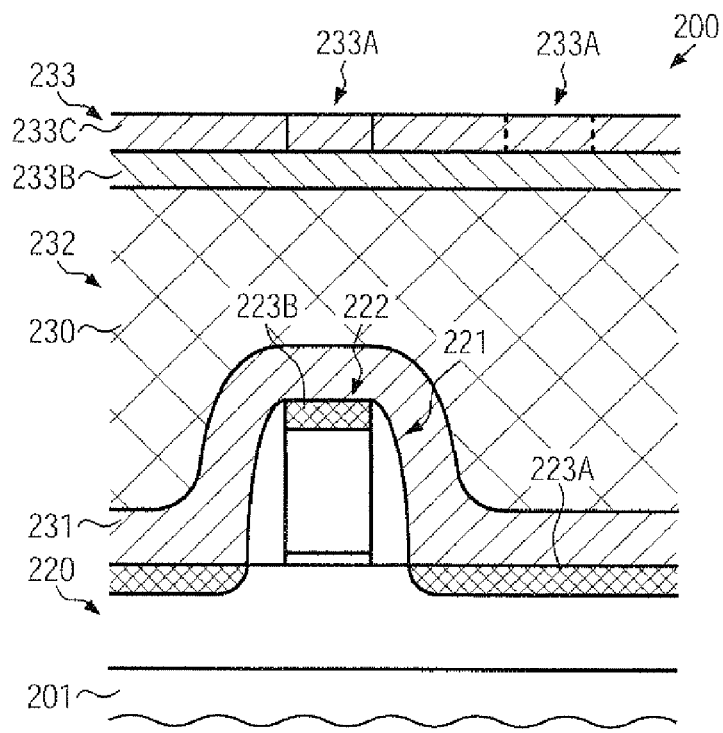
FIGS. 2k-2t schematically illustrate cross-sectional views and top views of a semiconductor device during various manufacturing stages in forming a contact opening on the basis of a hard mask, including a plurality of sub-layers and using two separately formed resist masks, according to still further illustrative embodiments.
Figure 2L:
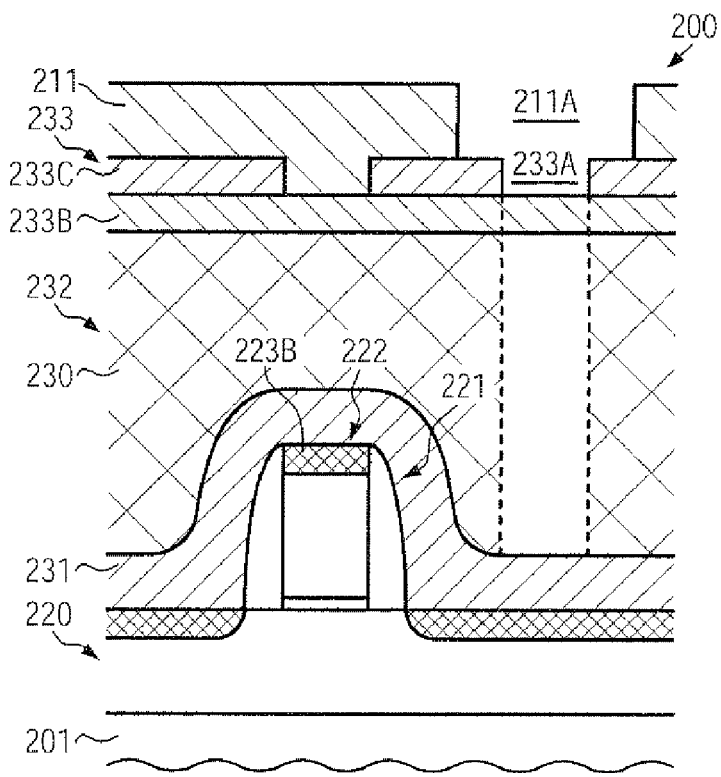
Figure 2M:
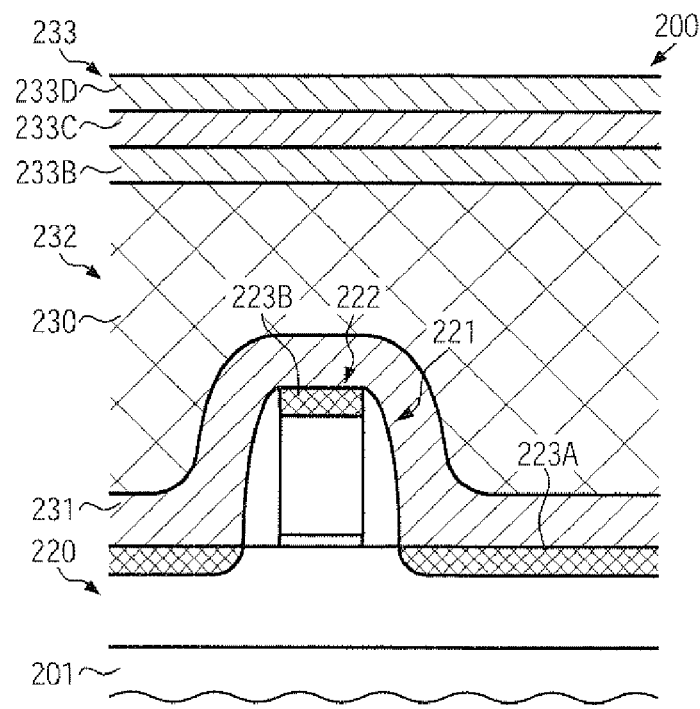
Figure 2N:
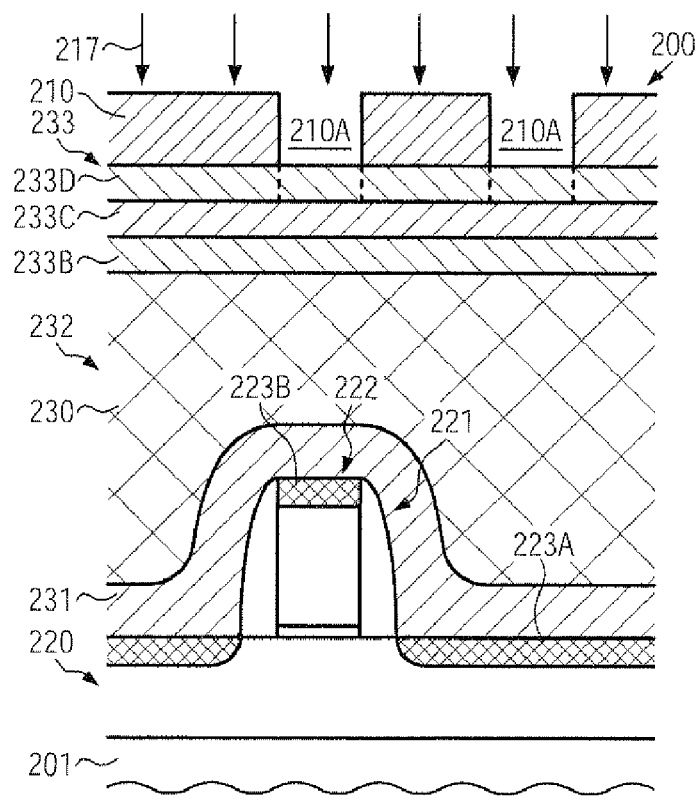
Figure 2O:
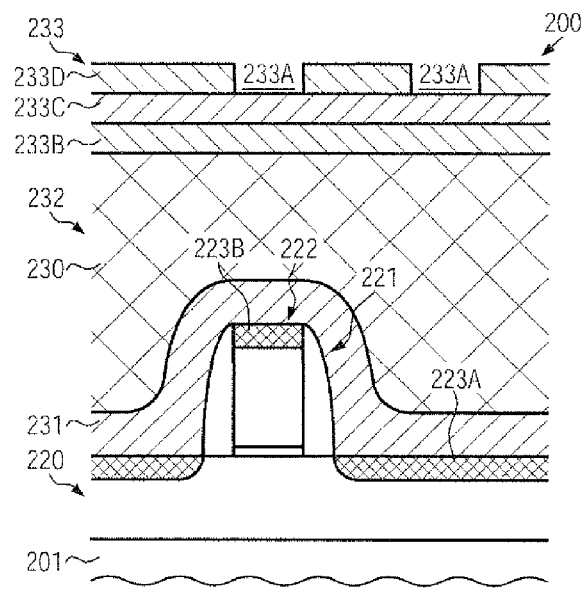
Figure 2P:
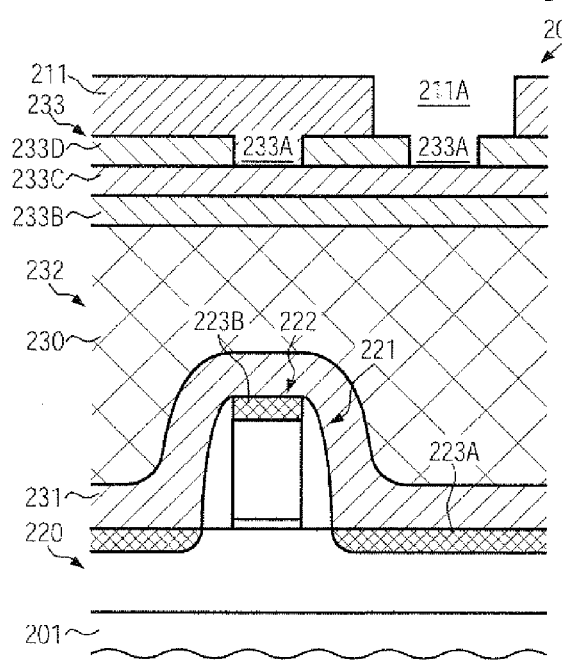
Figure 2Q:
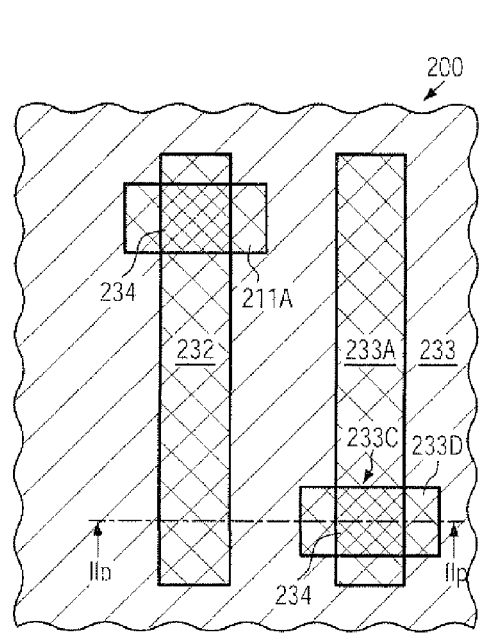
Figure 2R:
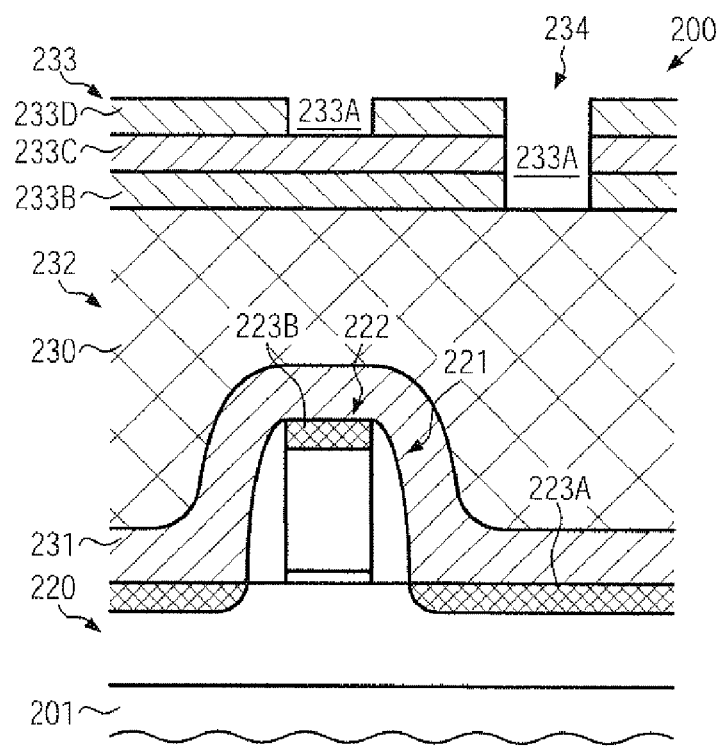
Figure 2S:
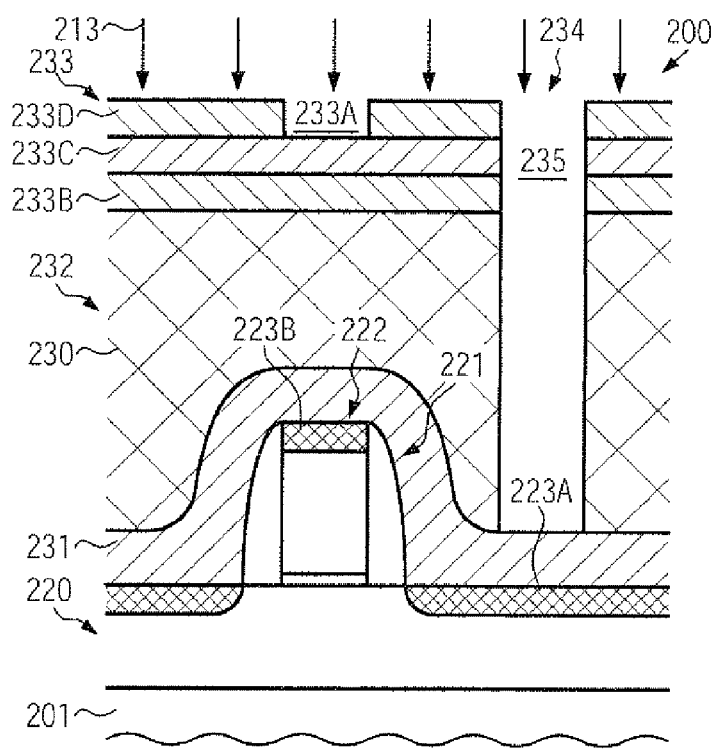
Figure 2T:
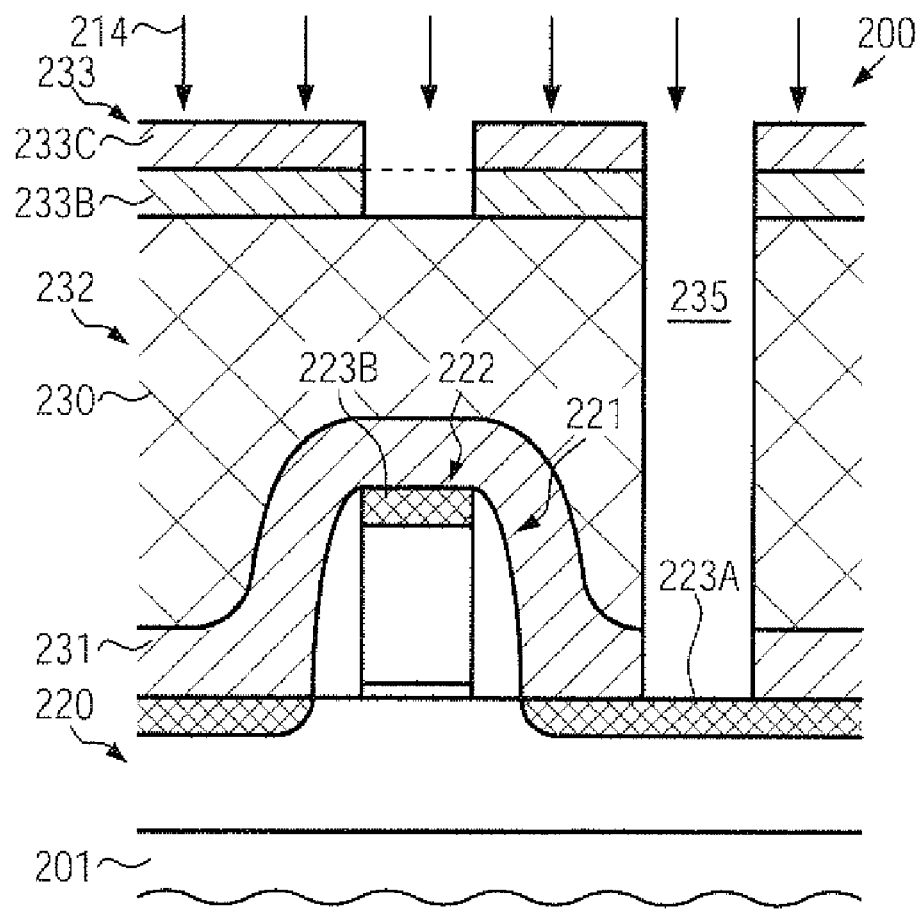

With reference to FIGS. 2a-2t, further illustrative embodiments will now be described in more detail, wherein reference may also be made to FIGS. 1a-1c, if appropriate.

FIG. 2a schematically illustrates a cross-sectional view of a semiconductor device 200 comprising a substrate 201 above which may be formed a semiconductor layer 220. The substrate 201 may represent any appropriate carrier material for forming thereabove the semiconductor layer 220, which may be provided in the form of a silicon-based layer, a germanium layer or any other appropriate semiconductor material that may be used for forming corresponding circuit elements 221 therein and thereabove. The circuit elements 221 may represent transistors, capacitors and the like, as may be required in view of the overall circuit configuration of the device 200. In the embodiment shown, the circuit element 221 may represent a field effect transistor, wherein it should be understood that any other circuit elements, such as bipolar transistors and the like, may be used as is required for the device 200. In sophisticated applications, the circuit elements 221 may be formed on the basis of critical device dimensions, such as a length 222L of a gate electrode 222, which may be approximately 50 nm and less, depending on the technology standard under consideration. Consequently, critical dimensions of other device levels, such as a contact structure 230 or any metallization level (not shown), may have to be formed on the basis of respective design dimensions that are adapted to the critical dimensions in the device level 220. The circuit elements 221 may further comprise respective contact areas 223A, 223B, which may be formed on or in the semiconductor layer 220 and/or in the gate electrode 222 and which may include a metal-containing material, such as a metal silicide and the like. Due to the reduced feature sizes in the device level 220, the corresponding lateral dimensions of the contact areas 223A, 223B may be reduced, thereby requiring highly sophisticated and thus critical patterning regimes for forming corresponding contact elements in the contact level 230. In the embodiment shown, the contact level 230 may comprise an interlayer dielectric material 232, for instance in the form of silicon dioxide and the like, possibly in combination with an etch stop material 231, such as silicon nitride and the like, or any other appropriate etch stop material. It should be appreciated, however, that the material composition of the dielectric components of the contact level 230 may be selected in any other appropriate manner so as to comply with device and process requirements for the device 200. For example, frequently, the contact etch stop layer 231 may be provided as a highly stressed dielectric material in order to enhance performance of field effect transistors due to a corresponding strain that may be induced in the semiconductor layer 220 below the gate electrode 222. On the other hand, the material composition of the interlayer dielectric material 232 may be selected so as to provide the desired chemical and mechanical characteristics for maintaining integrity of the circuit element 221 and provide an appropriate platform for forming further metallization layers above the contact level 230. Moreover, in the embodiment shown, the contact level 230 may further comprise a hard mask material 233, for instance in the form of silicon nitride, when well-established dielectric materials in the semiconductor process may be used in terms of providing a high degree of compatibility with conventional process techniques. In other cases, any other material may be used that provides a desired high etch selectivity with respect to at least the interlayer dielectric material 232. For example, silicon carbide, silicon oxynitride, certain high-k dielectric materials, for instance hafnium oxide and the like, may be used for this purpose. It should be appreciated that, frequently, in advanced semiconductor devices, high-k dielectric materials may be increasingly used in order to enhance overall performance of corresponding transistor elements. Some of these high-k dielectric materials may also exhibit a high etch selectivity with respect to a plurality of well-established materials used in the semiconductor production process and may readily be used as a hard mask material. Moreover, a resist mask 210 is formed above the hard mask layer 233 and comprises respective openings 210A, which may have lateral dimensions at least in one lateral direction that are to be understood as non-critical dimensions. That is, in some illustrative embodiments, a width 210W of the openings 210A may be selected to be greater than a corresponding lateral dimension of a contact opening to be formed in the interlayer dielectric material 232. Similarly, a length direction (not shown in FIG. 2a) may be selected to correspond to a critical dimension or may be selected to be greater than a corresponding critical dimension, i.e., a lateral dimension of contact elements determined by the corresponding design rules. In the embodiment shown in FIG. 2a, it may be assumed that the width 210W may substantially correspond to the design width of a corresponding contact element to be formed in the contact level 230, while a corresponding length dimension may be significantly greater than the dimension 210W.

FIG. 2b schematically illustrates a top view of the semiconductor device 200, in which an illustrative example for a configuration of the openings 210A is shown. In this example, the openings 210A may have a length dimension 210L that is significantly greater than the corresponding width 210W, which may be selected to correspond to the overall lateral dimensions of the circuit elements 221 (FIG. 2a) so that corresponding contact elements may be positioned with a required lateral offset to each other. For instance, respective positions 234A, 234B may correspond to positions and the lateral size of contact elements to be formed so as to connect to the contact areas 223A and 223B (FIG. 2a), respectively. Thus, the size and position of the contacts 234A, 234B may be defined by the position and the width 210W of the openings 210A while, however, in the length direction 210L, a corresponding restriction of the positions and sizes of the contact elements 234A, 234B may be accomplished on the basis of a further resist mask, which may be provided in a later manufacturing stage.

The semiconductor device 200 as shown in FIGS. 2a and 2b may be formed on the basis of the following processes. After forming the corresponding circuit elements 221, using well-established process techniques, the contact level 230 may be formed. For this purpose, the materials 231 and 232 may be provided in accordance with well-established process techniques, i.e., any plasma assisted deposition processes or thermally activated deposition techniques may be used, possibly followed by a corresponding planarization step for planarizing the resulting surface topography. Thereafter, the hard mask layer 233 may be formed, for instance, by plasma assisted CVD, thermally activated CVD, spin-on techniques, physical vapor deposition and the like, depending on the characteristics of the hard mask material 233. Thereafter, the resist mask 210 may be formed by using an appropriate lithography mask in order to expose the resist material so as to obtain latent images corresponding to the openings 210A. As previously discussed, since at least one of the lateral dimensions 210W, 210L may be significantly greater compared to a corresponding critical design dimension, a corresponding exposure process may be performed on the basis of less critical process constraints. It should be appreciated that, if required, the layer 233 or a portion thereof may act as an anti-reflective coating (ARC) material.

After forming the resist mask 210, in one illustrative embodiment, a selective etch process may be performed in which the corresponding openings 210A may be transferred into the mask material 233 so as to extend substantially completely through the mask layer 233, while, in other embodiments, the corresponding openings may extend into the mask material 233 without completely extending therethrough, as will be described later on in more detail. Respective anisotropic plasma assisted etch techniques are well established for a plurality of materials and corresponding recipes may be used for patterning the hard mask material 233. For example, a plurality of process recipes are available for etching silicon nitride in the presence of a resist material, wherein etch selectivity with respect to the interlayer dielectric material 232 may also be obtained. Hence, in a corresponding etch process, the material 232 may act as an efficient etch stop material.

FIG. 2c schematically illustrates the semiconductor device 200 in a further advanced manufacturing stage. As illustrated, openings 233A are provided in the hard mask material 233 so as to extend to the interlayer dielectric material 232, wherein the corresponding lateral dimensions may substantially correspond to the dimensions 210W, 210L (FIG. 2b). Furthermore, a second resist mask 211 may be formed above the hard mask layer 233 and may comprise a corresponding opening 211A having appropriate lateral dimensions to define, in combination with the hard mask 233, an intersection area 234 (FIG. 2d) having lateral dimensions that may substantially correspond to lateral dimensions of a contact element to be formed to connect to the contact area 223A.

FIG. 2d schematically illustrates a top view of the semiconductor device 200 of FIG. 2c. For convenience, the openings 211A defined by the resist mask 211 are indicated as dashed lines and the corresponding intersection 234 defined by the previously formed openings 233A and the openings 211A are illustrated as hatched areas. As is evident from FIG. 2d, corresponding lateral dimensions of the openings 211A may be selected so as to adjust a length dimension 234L of the intersection area 234 in accordance with design requirements for the corresponding contact elements. For example, if a reduced overall contact resistance may be desired, the length dimension 234L may be selected moderately high, as is compatible with the overall device configuration, while, in other cases, the dimension 234L may substantially correspond to a critical dimension, if a substantially square-like configuration of the corresponding contact elements may be desired. On the other hand, the width dimension of the intersection area 234 is defined by the width 210W, while, however, the opening 211A may significantly extend beyond the opening 233A, thereby also providing moderately relaxed process conditions during a corresponding lithography process for forming the resist mask 211. It should be appreciated that, in the above-described embodiments, the opening 211A may be provided in the form of the resist mask 211, while the openings 233A may have been formed in the mask layer 233 in the preceding manufacturing sequence. In other cases, the openings 233A may be formed so as to correspond to the openings 211A, while the resist mask 211 may be formed such that the corresponding openings formed therein correspond to the lateral dimensions of the openings 233A, as shown in FIG. 2d. At any rate, the corresponding lithography processes for defining the openings 233A and 211A may be performed on the basis of less restrictive lithography parameters compared to a process sequence in which both lateral dimensions of a corresponding contact element have to be defined on the basis of a single lithography step.

Again referring to FIG. 2c, it should be appreciated that the resist mask 211 may be formed, in some illustrative embodiments, on the basis of an additional planarization material (not shown), which may be provided so as to obtain a planarized surface topography, thereby filling the openings 233A previously formed in the hard mask layer 233. For example, any appropriate polymer material may be deposited by spin-on techniques and may be used as a planarization material, and possibly as an ARC material if required. Thereafter, the resist material may be provided and may be patterned on the basis of a corresponding lithography process, as previously described. If required, the corresponding planarization material may be removed from within the opening 211A, for instance on the basis of a specifically designed etch process, while, in other cases, the corresponding material may be removed during an etch process 213 that is designed to etch the interlayer dielectric material 232, while initially the corresponding planarization material may be removed. The etch process 213 may be performed on the basis of well-established anisotropic etch techniques when, for instance, silicon dioxide may be used as the interlayer dielectric material 232 in combination with silicon nitride material for the mask layer 233. As previously explained, any other materials may also be used as long as a pronounced etch selectivity between the material 233 and the interlayer dielectric material 232 is obtained. In the illustrative embodiment shown in FIG. 2c, the resist mask 211, possibly in combination with a corresponding planarization material, may provide reliable coverage of any portions of the openings 233A outside the opening 211A.

FIG. 2e schematically illustrates the semiconductor device 200 in a further advanced manufacturing stage, in which a contact opening 235 is formed in the interlayer dielectric material 232, which may have lateral dimensions as are defined by the intersection area 234 (FIG. 2d). Moreover, depending on the etch recipe used, a significant portion of the resist mask 211 may also have been consumed during the preceding etch process, while, in other cases, as previously explained, a corresponding planarization material, as indicated by 212, may optionally provide additional etch stop capabilities. In other cases, the outer-most layer 233 may comprise two or more sub-layers, as will be described later on in more detail, when a corresponding resist material, possibly in combination with the fill material 212, may not provide the required etch stop capabilities.

FIG. 2f schematically illustrates the semiconductor device 200 when exposed to a further etch ambient 214 that is designed to remove material of the etch stop layer 231 selectively to the interlayer dielectric material 232. For example, well-established and highly selective anisotropic etch techniques are well established to etch silicon nitride material selectively to silicon dioxide material. In the embodiments shown, it may be assumed that the hard mask material 233 may also be comprised of silicon nitride, which may thus also be removed, at least within the opening 211A (FIG. 2e) and which may also be removed in other portions when finally the resist mask 211 (FIG. 2e) may be completely consumed. In other illustrative embodiments, prior to performing the etch process 214, the remaining resist mask 211 may be removed by any appropriate resist strip process and the exposed mask layer 233 may be etched along with the etch stop layer 231, wherein a thickness of the mask layer 233 may be appropriately adjusted so as to be substantially completely removed during the etch process 214.

FIG. 2g schematically illustrates a top view of the device of FIG. 2f. As illustrated, the contact areas 223A, 223B are exposed via the corresponding contact openings 235, which may have lateral dimensions that substantially correspond to the dimensions of the intersection area 234 (FIG. 2d). Furthermore, in FIG. 2g, it may be assumed that portions of the initial hard mask layer 233 are still present outside of an area corresponding to the opening 211A (FIG. 2e) and outside of the openings 233A (FIG. 2d). In other cases, as discussed before, the layer 233 may be substantially completely removed during the etch process 214.

FIG. 2h schematically illustrates the semiconductor device 200 in a further advanced manufacturing stage. As illustrated, the contact opening 235 may be filled with a metal-containing material 236, such as tungsten, copper, aluminum and the like, possibly in combination with a corresponding barrier material 237, such as titanium nitride, titanium, tantalum, tantalum nitride and the like, depending on the overall device requirements. The materials 237, 236 may be deposited on the basis of well-established process techniques, such as CVD, sputter deposition, electroless deposition, electroplating and the like, depending on the materials used. Furthermore, the semiconductor device 200 may be subjected to a removal process 215, for instance in the form of a chemical mechanical polishing (CMP) process, to remove excess material of the layers 237, 236, while, in some illustrative embodiments, residues of the hard mask layer 233 may also be removed during the process 215.

FIG. 2i schematically illustrates a cross-sectional view of the semiconductor device 200 after the removal process 215 of FIG. 2h. As illustrated, a contact element 238 may be formed which defines an interface 238S (FIG. 2j) with the contact area 223A, the lateral extension of which may be defined on the basis of less critical photolithography processes to define the intersection area 234 (FIG. 2d).

FIG. 2j schematically illustrates a top view of the interface 238S, which may have a substantially rectangular configuration with a width 238W and a length 238L, which may be determined by the corresponding lateral dimensions of the intersection area 234 (FIG. 2d) and the corresponding etch parameters of the process 214 (FIG. 2f), since a corresponding inclination of respective sidewalls of the contact opening 235 (FIG. 2f) may be obtained. As previously discussed, at least one of the lateral dimensions 238W, 238L may be varied with increased flexibility in order to adapt to the overall characteristics of the contact element 238 to the device requirements. For instance, if the lateral dimension 238W may be substantially restricted by the design rules, in view of closely spaced neighboring circuit elements and the like, the length 238L may be selected appropriately large in order to reduce the overall contact resistance of the contact element 238. In this case, well-established "conventional" metal-containing materials, such as tungsten, may be used on the basis of less critical lithography techniques, even for highly scaled semiconductor devices, since an increased overall area of the interface 238S may compensate for a reduced conductivity of tungsten material compared to highly conductive metals, such as copper and the like, while nevertheless critical dimensions in the width direction may be respected.

FIG. 2k schematically illustrates the semiconductor device 200 according to further illustrative embodiments in which the hard mask layer 233 may comprise at least two different sub-layers 233B, 233C. Thus, as previously discussed, if a resist mask is considered inappropriate for withstanding an etch ambient for etching through the interlayer dielectric material 232, the opening 233A may be formed in the upper sub-layer 233C, which may be accomplished on the basis of a corresponding resist mask, such as the mask 210 (FIG. 2a). During the corresponding patterning process, the layer 233B may act as an etch stop layer.

FIG. 2l schematically illustrates the device 200 in a further advanced manufacturing stage in which the etch mask 211 may define the opening 211A, which may then be used for deepening the opening 233A so as to extend through the layer 233B. During the corresponding patterning process, the layer 233C may act as a mask, in combination with the resist mask 211, which may be accomplished by, for instance, providing the material 233C in the form of a silicon dioxide material and the material 233B as a silicon nitride material. Hence, when forming the openings 233A, well-established etch techniques may be used for etching silicon dioxide selectively to silicon nitride and, thereafter, a further selective etch process may be used for selectively etching silicon nitride with respect to silicon dioxide material, thereby obtaining the opening 233A to extend through the layer 233B within the opening 211A.

Thereafter, the resist mask 211 may be removed and the further processing may be continued as previously described, wherein the layer 233B may be efficiently used as a mask material, while the layer 233C may be consumed during the corresponding process for etching through the interlayer dielectric material 232. That is, during the etching of the material 232, which may be comprised of silicon dioxide, the material of the layer 233C may also be removed. Thus, also in this case, an efficient patterning regime may be obtained on the basis of less critical lithography steps, while a significant etch resistivity of the resist mask 211 may not be required.

With reference to FIGS. 2m-2t, further illustrative embodiments will now be described in which the hard mask layer may comprise more than two sub-layers.

FIG. 2m schematically illustrates the semiconductor device 200 in which the hard mask layer 233 comprises the first sub-layer 233B, the second sub-layer 233C and a third sub-layer 233D. For example, the sub-layers 233B, 233D may be comprised of silicon nitride, while the layer 233C may be comprised of silicon dioxide. It should be appreciated, however, that any other materials may be used as long as the desired etch selectivity of the layer 233D with respect to the layer 233C and to the layer 232 is provided.

FIG. 2n schematically illustrates the semiconductor device 200 with the resist mask 210 formed in the openings 210A, as also previously explained, in order to transfer the openings 210A into the layer 233D on the basis of a corresponding selective etch process 217.

FIG. 2o schematically illustrates the semiconductor device 200 after the etch process 217 and the removal of the resist mask 210 (FIG. 2n). Thus, the openings 233A are formed in the layer 233D in accordance with design requirements, as previously explained.

FIG. 2p schematically illustrates the semiconductor device 200 with the resist mask 211 formed so as to have the corresponding openings 211A, thereby defining the intersection area 234 (FIG. 2q).

FIG. 2q schematically illustrates a top view of the semiconductor device 200 of FIG. 2p. As illustrated, the openings 233A may expose the layer 233C while the remaining portions of the device 200 may be covered by the layer 233D. Furthermore, the openings 211A may define, in combination with the openings 233A, the intersection area 234.

FIG. 2r schematically illustrates the semiconductor device 200 in a further advanced manufacturing stage in which the openings 233A corresponding to the intersection area 234 extend through the entire hard mask layer 233, while the openings 233A outside of the intersection area 234 are formed in the layer 233D only. This may be accomplished by performing an appropriate etch process on the basis of the mask 211 (FIG. 2p), in which may be etched through the layer 233C and through the layer 233B, which may be accomplished on the basis of two different etch chemistries or on the basis of a single etch chemistry that may etch both materials of the layers 233C and 233B with a moderately high etch rate. For instance, when the layer 233C is comprised of silicon dioxide and the layer 233B is comprised of silicon nitride, corresponding selective etch recipes are available and may be used for a corresponding etch sequence. In other cases, an etch recipe without a pronounced selectivity with respect to these materials may be used, wherein also a certain degree of material removal may occur in the layer 232.

FIG. 2s schematically illustrates the semiconductor device 200 when exposed to the etch process 213 designed to etch through the interlayer dielectric material 232. During the process 213, at least the layer 233B may provide integrity of the material 232 within openings 233A, which may not correspond to the intersection area 234. In other cases, the layer 233D may provide the desired etch stop capabilities, while, in the intersection area 234, the contact opening 235 may be formed so as to extend to the etch stop layer 231 formed above the contact area 223A.

FIG. 2t schematically illustrates the semiconductor device 200 when exposed to the etch process 214 designed to etch through the contact etch stop layer 231. In some illustrative embodiments, the layer 233B may also provide etch stop capabilities during the process 214, for instance when comprised of a material having an increased etch resistivity with respect to the silicon nitride etching ambient of the process 214. For instance, as previously discussed, high-k dielectric materials may increasingly be used during semiconductor processing, and a corresponding material may also be advantageously used for the layer 233B, thereby providing a pronounced etch selectivity with respect to, for instance, silicon dioxide, silicon nitride and the like. In other cases, the layer 233B may be provided in the form of a silicon carbide material, which may also have a significantly reduced etch rate with respect to an etch chemistry designed to etch through the etch stop layer 231. In still other illustrative embodiments, the etch chemistry 214 may provide a high degree of etch selectivity with respect to silicon dioxide and thus a removal of the layer 233B may not be considered disadvantageous since the process may stop on the interlayer dielectric material 232. On the other hand, the layer 233C may provide etch stop capabilities outside of the openings 233A (FIG. 2r), thereby providing enhanced integrity of the material 232.

Thereafter, the further processing may be continued, for instance, by filling in any metal-containing material and removing excess material thereof by CMP, while also removing the layers 233C, 233B.

As a result, the present disclosure provides semiconductor devices and techniques for forming the same in which contact elements may be formed on the basis of two independent resist masks, the mask openings of which may be formed with at least one non-critical lateral dimension, thereby providing enhanced conditions of the corresponding photolithography processes. For example, a resist mask may be formed first, which may have a mask opening based on two non-critical lateral dimensions, followed by a corresponding patterning sequence, after which a further resist mask may be formed wherein at least one lateral dimension may have a critical dimension, whereas the other lateral dimension may also be selected non-critical, wherein a commonly defined intersection area may result in the desired overall design dimensions of the contact element under consideration. In other cases, as described above, the first resist mask may comprise one critical dimension, while the second resist mask may be provided with one or no critical lateral dimension at all, depending on the overall device requirements. Furthermore, the patterning of the hard mask material may be accomplished on the basis of an additional planarization material, such as a polymer material, if enhanced surface conditions are required during the lithographical patterning of the second resist mask. In other illustrative embodiments, in addition to providing a corresponding planarization material, the hard mask material may be provided in the form of two or more sub-layers, at least two of which may have a different material composition to enhance the overall patterning sequence, for instance, when a resist material may not provide sufficient etch resistivity to withstand the etch attack during an anisotropic etch process for patterning the interlayer dielectric material. It should be appreciated that, although embodiments described above may refer to contact elements connecting to a circuit element, such as a transistor, in other cases, any critical contact elements, such as vias connecting different metallization layers, may also be formed on the basis of the principles disclosed above.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
  forming a first resist mask above a hard mask layer formed on a material layer of a semiconductor device;
  forming a first opening in said hard mask layer on the basis of said first resist mask, said first opening having a first dimension along a first lateral direction and a second dimension along a second lateral direction that is different from said first lateral direction, said first dimension being less than said second dimension, and said second dimension corresponding to a lateral dimension of the semiconductor device;
  forming a second resist mask above said hard mask layer, said second resist mask having a second opening that defines an intersection area with said first opening, said second opening having first and second lateral dimensions that are less than the second dimension of the first opening; and
  forming a contact opening in said material layer on the basis of said intersection area.

2. The method of claim 1, wherein said second opening has at least one lateral dimension that is greater than said first lateral dimension.

3. The method of claim 1, wherein forming said first opening in said hard mask layer comprises performing a selective etch process to remove material of said hard mask layer selectively to said material layer.

4. The method of claim 1, wherein forming said first opening comprises forming a first portion of said first opening to extend through a first sub-layer of said hard mask layer and forming a second portion of said first opening on the basis of said intersection area to extend through at least a second sub-layer of said hard mask layer.

5. The method of claim 1, wherein said contact opening connects to a contact region of a transistor element formed in and above a semiconductor layer.

6. The method of claim 1, wherein said contact opening extends to a metal region formed in a metallization layer of said semiconductor device.

7. The method of claim 1, further comprising filling said contact opening with a metal-containing material and removing excess material of said metal-containing material and residues of said hard mask layer in a common removal process.

8. The method of claim 3, wherein forming said contact opening on the basis of said intersection area comprises performing a second selective etch process to remove material of said material layer and using said second resist mask and said hard mask layer as etch masks.

9. The method of claim 8, wherein forming said contact opening further comprises performing said second etch process and using a contact etch stop layer to control said second etch process and performing a third etch process to open said contact etch stop layer and using at least one of said material layer, said hard mask layer and said second resist mask as etch masks in said third etch process.

10. The method of claim 4, wherein said second portion extends through a third sub-layer of said hard mask layer.

11. The method of claim 10, wherein at least two of said first, second and third sub-layers are comprised of different material compositions.

12. A method, comprising:
forming a first resist mask above a hard mask layer formed on a material layer of a semiconductor device;
forming a first opening in said hard mask layer on the basis of said first resist mask, said first opening having a first dimension along a first lateral direction and a second dimension along a second lateral direction that is different from said first lateral direction, said first dimension being less than said second dimension, and said second dimension corresponding to a lateral dimension of the semiconductor device;
forming a second resist mask above said hard mask layer, said second resist mask having a second opening that defines an intersection area with said first opening, said second opening having first and second lateral dimensions that are less than the second dimension of the first opening, wherein said second opening has at least one lateral dimension that is greater than said first lateral dimension, and wherein the first and second lateral dimensions of said second opening are both greater than said first lateral dimension of said first opening; and
forming a contact opening in said material layer on the basis of said intersection area.

13. A method, comprising:
forming a hard mask layer above an interlayer dielectric material of a semiconductor device;
forming an opening in said hard mask layer using a first resist mask, said opening having a rectangular portion, wherein a largest lateral dimension of the rectangular portion corresponds to a lateral dimension of the semiconductor device;
forming a mask opening in said rectangular portion using a second resist mask, said mask opening extending through said hard mask layer; and
forming a contact opening in said interlayer dielectric material by using said mask opening, said contact opening extending through said interlayer dielectric material.

14. The method of claim 13, wherein said opening is formed to extend through said hard mask layer and said mask opening is formed by an intersection area formed by said portion and said second resist mask.

15. The method of claim 13, wherein said opening extends to a first sub-layer of said hard mask layer.

16. The method of claim 13, wherein a smaller one of the lateral dimensions of said rectangular portion corresponds to a critical dimension associated with said contact opening.

17. The method of claim 13, further comprising filling said contact opening with a metal-containing material and removing said hard mask layer and excess material of said metal-containing material in a common removal process.

18. The method of claim 16, wherein said mask opening has a substantially rectangular top surface.

19. The method of claim 16, wherein said second resist mask is formed so as to have lateral dimensions that are greater than said critical dimension.

20. A method, comprising:
forming a first resist mask above a hard mask layer formed on a material layer of a semiconductor device;
forming a first opening in said hard mask layer on the basis of said first resist mask, said first opening having a first dimension along a first lateral direction and a second dimension along a second lateral direction that is different from said first lateral direction, said first dimension being less than said second dimension, and said second dimension corresponding to a lateral dimension of the semiconductor device;
forming a second resist mask above said hard mask layer, said second resist mask having a second opening that defines an intersection area with said first opening, said second opening having first and second lateral dimensions that are less than the second dimension of the first opening;
forming a third opening in said hard mask layer on the basis of said first resist mask, wherein the third opening is offset from the first opening along the first lateral direction, said third opening having the first dimension along the first lateral direction and the second dimension along the second lateral direction; and
forming a contact opening in said material layer on the basis of said intersection area.

21. The method of claim 20, wherein forming the second resist mask comprises forming a second resist mask having a fourth opening that defines a second intersection area with said third opening, said forth opening having first and second lateral dimensions that are less than the second dimension of the first opening.

22. The method of claim 21, wherein the fourth opening does not overlap with the first opening, and wherein the second opening does not overlap with the third opening.

23. The method of claim 22, wherein the fourth opening is offset from the second opening along the second lateral dimension.

24. A method, comprising:
forming a hard mask layer above an interlayer dielectric material of a semiconductor device;
forming first and second openings in said hard mask layer using a first resist mask, said first and second openings each having a rectangular portion, wherein a largest lateral dimension of the rectangular portion corresponds to a first lateral dimension of the semiconductor device along a first lateral direction, and wherein the first and second openings are offset from each other along a second lateral direction that is different than the first lateral direction;
forming first and second mask openings in said rectangular portion using a second resist mask, said first and second mask openings extending through said hard mask layer; and forming first and second contact openings in said interlayer dielectric material by using said first and second openings, said first and second contact openings extending through said interlayer dielectric material.

25. A method, comprising:

forming a hard mask layer above an interlayer dielectric material of a semiconductor device;

forming a plurality of openings in said hard mask layer using a first resist mask, the plurality of openings each having a rectangular portion, wherein a largest lateral dimension of the rectangular portion corresponds to a first lateral dimension of the semiconductor device along a first lateral direction, and wherein the plurality of openings are offset from each other along a second lateral direction that is different than the first lateral direction;

forming a plurality of mask openings in said rectangular portion using a second resist mask, said plurality of mask openings extending through said hard mask layer; and forming a plurality of contact openings in said interlayer dielectric material by using said plurality of openings, said plurality of contact openings extending through said interlayer dielectric material.

* * * * *